United States Patent
Chen et al.

(10) Patent No.: US 12,333,230 B2
(45) Date of Patent: Jun. 17, 2025

(54) METHOD AND APPARATUS FOR DETERMINING DELAY PARAMETER, STORAGE MEDIUM, AND ELECTRONIC DEVICE

(71) Applicant: CHANGXIN MEMORY TECHNOLOGIES, INC., Hefei (CN)

(72) Inventors: Yue Chen, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 600 days.

(21) Appl. No.: 17/840,959

(22) Filed: Jun. 15, 2022

(65) Prior Publication Data

US 2023/0267254 A1 Aug. 24, 2023

Related U.S. Application Data

(63) Continuation of application No. PCT/CN2022/080234, filed on Mar. 10, 2022.

(30) Foreign Application Priority Data

Feb. 18, 2022 (CN) .......................... 202210152967.6

(51) Int. Cl.
*G06F 30/3312* (2020.01)
*G06F 30/3315* (2020.01)
(Continued)

(52) U.S. Cl.
CPC ...... *G06F 30/3312* (2020.01); *G06F 30/3315* (2020.01); *G06F 30/396* (2020.01); *G06F 30/398* (2020.01); *G11C 11/4076* (2013.01)

(58) Field of Classification Search
CPC ............. G06F 30/3312; G06F 30/3315; G06F 30/396; G06F 30/398; G11C 11/4076
(Continued)

(56) References Cited

U.S. PATENT DOCUMENTS

| | | | | |
|---|---|---|---|---|
| 5,935,257 A | * | 8/1999 | Nishimura | ............ H03L 7/0814 713/503 |
| 6,367,060 B1 | * | 4/2002 | Cheng | ................... G06F 30/327 716/122 |

(Continued)

FOREIGN PATENT DOCUMENTS

| | | |
|---|---|---|
| CN | 101673524 A | 3/2010 |
| CN | 106936531 A | 7/2017 |

(Continued)

OTHER PUBLICATIONS

Shi et al., Chinese Patent Document No. CN-113009201-A, published Jun. 22, 2021, 3 pages including abstract and claims. (Year: 2021).*

(Continued)

*Primary Examiner* — Phallaka Kik
(74) *Attorney, Agent, or Firm* — Kilpatrick Townsend & Stockton LLP

(57) ABSTRACT

A method and an apparatus for determining a delay parameter, a computer readable storage medium, and an electronic device are provided. The method for determining the delay parameter includes: determining (S210) a setup time of a clock signal in a memory relative to a DQ data signal; dividing (S220) the clock signal into a plurality of clock sub-signals, and determining (S220) a target sampling delay of the plurality of clock sub-signals relative to the DQ data signal; and determining (S230), according to the target sampling delay and the setup time, a delay parameter of the DQ data signal relative to the clock signal.

20 Claims, 7 Drawing Sheets

(51) Int. Cl.
*G06F 30/396* (2020.01)
*G06F 30/398* (2020.01)
*G11C 11/4076* (2006.01)

(58) Field of Classification Search
USPC ............ 716/108, 113, 134, 136; 703/16, 19
See application file for complete search history.

(56) References Cited

U.S. PATENT DOCUMENTS

| | | | | |
|---|---|---|---|---|
| 6,557,150 | B1* | 4/2003 | Honmura | G06F 30/33 |
| | | | | 716/113 |
| 6,675,272 | B2* | 1/2004 | Ware | G06F 3/0673 |
| | | | | 711/170 |
| 7,421,675 | B1* | 9/2008 | Campbell | G06F 30/3312 |
| | | | | 703/19 |
| 7,886,176 | B1* | 2/2011 | Svoiski | H03L 7/0816 |
| | | | | 327/158 |
| 8,589,717 | B1* | 11/2013 | Davis | G06F 1/04 |
| | | | | 713/600 |
| 8,866,801 | B2* | 10/2014 | Yen | G09G 3/2096 |
| | | | | 345/204 |
| 9,465,405 | B1* | 10/2016 | Miller | G06F 13/4217 |
| 10,916,278 | B1* | 2/2021 | Chi | G11C 29/028 |
| 2002/0017939 | A1* | 2/2002 | Okuda | G11C 7/1051 |
| | | | | 327/296 |
| 2003/0117864 | A1* | 6/2003 | Hampel | G06F 3/061 |
| | | | | 365/200 |
| 2006/0077731 | A1* | 4/2006 | Ware | G11C 5/04 |
| | | | | 365/194 |
| 2006/0229828 | A1* | 10/2006 | Hathaway | G06F 30/367 |
| | | | | 702/57 |
| 2007/0226442 | A1* | 9/2007 | Lai | G06F 13/4291 |
| | | | | 711/167 |
| 2008/0136456 | A1* | 6/2008 | Chen | G01R 31/31727 |
| | | | | 327/33 |
| 2010/0002819 | A1* | 1/2010 | Conner | G06F 11/263 |
| | | | | 375/355 |
| 2010/0060557 | A1 | 3/2010 | Hsu | |
| 2011/0022934 | A1* | 1/2011 | Oh | H04L 7/0008 |
| | | | | 714/E11.023 |
| 2011/0302460 | A1* | 12/2011 | Idgunji | G01R 31/3016 |
| | | | | 714/E11.024 |
| 2013/0038582 | A1* | 2/2013 | Yen | G09G 3/2096 |
| | | | | 345/204 |
| 2019/0339733 | A1* | 11/2019 | Lee | G06F 1/324 |
| 2020/0233832 | A1* | 7/2020 | Jamadagni | G06F 13/4217 |
| 2023/0206974 | A1* | 6/2023 | Kim | G11C 11/4076 |
| | | | | 713/400 |

FOREIGN PATENT DOCUMENTS

| | | |
|---|---|---|
| CN | 113178223 A | 7/2021 |
| CN | 113535620 A | 10/2021 |
| CN | 113985251 A | 1/2022 |
| EP | 2884351 A1 | 6/2015 |

OTHER PUBLICATIONS

Yang, Chinese Patent Document No. CN-107395198-A, published Nov. 24, 2017, 3 pages including abstract, claims and 1 drawing. (Year: 2017).*

Osamu Nagashima, Shunichi Saito, Micron. "Proposed LPDDR5/LPDDR5X JEDEC Specification" Committee: 1 JC-42.6 Item No. 1854.99B, Apr. 1, 2021, 647 pages.

* cited by examiner

METHOD AND APPARATUS FOR DETERMINING DELAY PARAMETER, STORAGE MEDIUM, AND ELECTRONIC DEVICE

CROSS-REFERENCE TO RELATED APPLICATION

The present application is a continuation application of International Patent Application No. PCT/CN2022/080234, filed on Mar. 10, 2022, which is based upon and claims priority to Chinese Patent Application No. 202210152967.6, filed on Feb. 18, 2022, and entitled "Method and Apparatus for Determining Delay Parameter, Storage Medium, and Electronic Device". The disclosures of International Patent Application No. PCT/CN2022/080234 and Chinese Patent Application No. 202210152967.6 are hereby incorporated by reference in their entireties.

BACKGROUND

Dynamic random access memory (DRAM) is a semiconductor memory device commonly used in computers. Because DRAM has the advantages of simple structure, high density, low power consumption and low price, it has been widely used in the computer field and the electronic industry.

In general, during the DRAM design process, the clock signal WCK is divided into four stage signals, and DQ (data I/O channel) data acquisition is performed through the four stage signals.

However, in practical applications, due to a delay of the four stage signals, there may be a case in which erroneous DQ data is collected.

SUMMARY

The present disclosure relates to a technical field of integrated circuit, and particularly, to a method and an apparatus for determining a delay parameter, a computer readable storage medium, and an electronic device.

According to an aspect of the present disclosure, a method for determining a delay parameter is provided, the method includes that: a setup time of a clock signal in a memory relative to a DQ data signal is determined; the clock signal is divided into a plurality of clock sub-signals, and a target sampling delay of the plurality of clock sub-signals relative to the DQ data signal is determined; and a delay parameter of the DQ data signal relative to the clock signal is determined according to the target sampling delay and the setup time.

According to an aspect of the present disclosure, an apparatus for determining a delay parameter is provided, the apparatus includes a processor and a memory for storing executable instructions executed by the processor. The processor is configured to: determine a setup time of a clock signal in a memory relative to a DQ data signal; divide the clock signal into a plurality of clock sub-signals, and determine a target sampling delay of the plurality of clock sub-signals relative to the DQ data signal; and determine, according to the target sampling delay and the setup time, a delay parameter of the DQ data signal relative to the clock signal.

According to an aspect of the present disclosure, there is provided a non-transitory computer-readable storage medium having stored thereon a computer program which, when executed by a processor, implements the method for determining the delay parameter. The method includes that: a setup time of a clock signal in a memory relative to a DQ data signal is determined; the clock signal is divided into a plurality of clock sub-signals, and a target sampling delay of the plurality of clock sub-signals relative to the DQ data signal is determined; and a delay parameter of the DQ data signal relative to the clock signal is determined according to the target sampling delay and the setup time.

BRIEF DESCRIPTION OF THE DRAWINGS

The drawings herein, which are incorporated into and constitutes a part of the description, illustrate embodiments consistent with the disclosure, and together with the description serve to explain the principles of the disclosure. It will be apparent that the drawings in the description hereinafter are merely some embodiments of the present disclosure, and for those skilled in the art, other drawings can also be obtained from these drawings without creative efforts.

DETAILED DESCRIPTION

Figure 1:
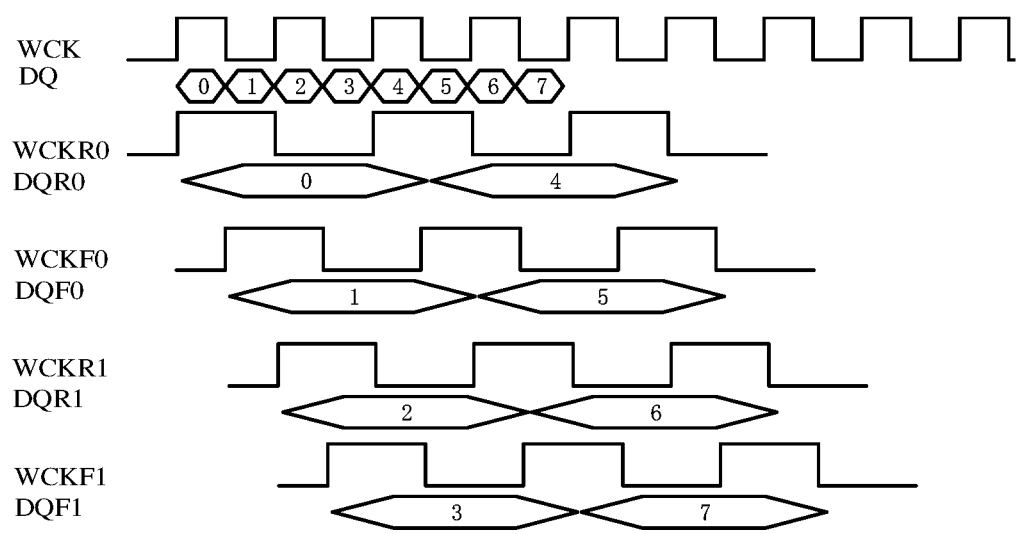
FIG. 1 schematically illustrates a schematic structural diagram of a clock signal which is divided into four clock sub-signals according to an exemplary embodiment of the present disclosure.

Exemplary embodiments will now be described more fully with reference to the drawings. However, exemplary embodiments can be implemented in various forms, and should not be construed as limited to the examples set forth herein. Rather, these embodiments are provided so that the present disclosure will be more comprehensive and complete, and the concept of exemplary embodiments will be fully conveyed to those skilled in the art. The same reference numerals in the drawings denote the same or similar structures, and thus detailed descriptions thereof will be omitted.

Although relative terms (such as, "above" and "below") are used in the description to describe the relative relationship between one component and another component illustrated in the drawings, these terms are used in this description for convenience only, which is, for example, according to the directions of the examples described in the drawings. It will be appreciated that if the device in the drawings is turned upside down, the components described as "above" will become the components described as "below". Other relative terms (such as "high", "low", "top", "bottom", "left" and "right") are also used to have similar meanings. When a structure is "above" other structures, it may mean that that the structure is integrally formed on other structures, or that the structure is "directly" arranged on other structures, or that the structure is "indirectly" arranged on other structures through another structure.

The terms "a", "one" and "said" are used to indicate the presence of one or more elements/compositional distinctions/etc. The terms "include" and "have" are used to indicate an open-ended inclusive meaning, and mean that additional elements/compositional distinctions/etc., may be present in addition to the listed elements/compositional distinctions/etc.

Semiconductor memory is used for a computer, a server, a handheld device such as a mobile phone, a printer, and many other electronic devices and applications. The semiconductor memory may include a plurality of memory cells in a memory array, each memory cell may store at least one bit of information. DRAM is an example of such semiconductor memory. The present disclosure is preferably used in DRAM. Accordingly, the description of the following embodiments is made with reference to the DRAM as a non-limiting example.

In a DRAM integrated circuit device, particularly in a LPDDR5 (Low Power Double Data Rate SDRAM), referring to FIG. 1, the clock signal WCK is divided into four clock sub-signals WCKR0, WCKF0, WCKR1 and WCKF1 during the design process. Ideally, as long as the four clock sub-signals have write data signals aligned therewith, i.e., DQR0 is aligned with WCKR0, DQF0 is aligned with WCKF0, DQR1 is aligned with WCKR1, and DQF1 is aligned with WCKF1, the DQ data can be sampled correctly under the four clock sub-signals. The DQ data may be transmitted by means of a DQ signal, and the signal transmitted by each data pin DQ PAD of the DRAM is referred to as the DQ signal.

However, in practical situations, due to a difference between different devices, such as a process difference, etc., the four clock sub-signals WCKR0, WCKF0, WCKR1, and WCKF1 have delays with different degrees, and the delays are generally not easy to know. In this case, if the DQ data is continuously transmitted in the aforementioned alignment manner, it is easy to cause a data sampling error on the rising edge of the four clock stages. Therefore, it is necessary to transmit the DQR0, DQF0, DQR1 and DQF1 signals described above with an appropriate delay, so as to ensure that the DQ data can be correctly captured on the rising edge stage. The aforementioned delay transmission parameter of the DQ signal is the delay parameter tWCK2DQI to be determined in the embodiments of the present disclosure.

Figure 2:
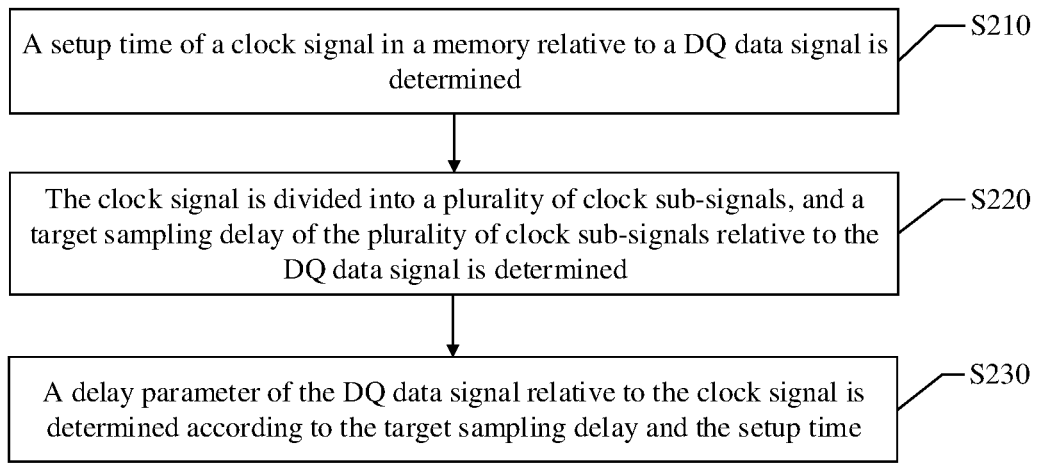
FIG. 2 schematically illustrates a flowchart of a method for determining a delay parameter according to an exemplary embodiment of the present disclosure.

Referring to FIG. 2, a method for determining a delay parameter according to an exemplary embodiment of the present disclosure includes the following operations of S210 to S230.

In S210, a setup time of a clock signal in a memory relative to a DQ data signal is determined.

In S220, the clock signal is divided into a plurality of clock sub-signals, and a target sampling delay of the plurality of clock sub-signals relative to the DQ data signal is determined.

In S230, a delay parameter of the DQ data signal relative to the clock signal is determined according to the target sampling delay and the setup time.

In the method for determining the delay parameter according to the exemplary embodiment of the present disclosure, on the one hand, the delay parameter of the DQ data signal can be determined in combination with the target sampling delay of the plurality of clock sub-signals relative to the DQ data signal and based on the setup time. That is, according to the actual situation of the setup time and the target sampling delay, the problem that the clock sub-signal cannot effectively sample the DQ data can be solved, and the correct DQ data can be ensured to be collected. On the other hand, automatic determination of the delay parameter can be achieved, and thus, the time-consuming and high-cost problems caused by manual measurement can be avoided.

Figure 3:
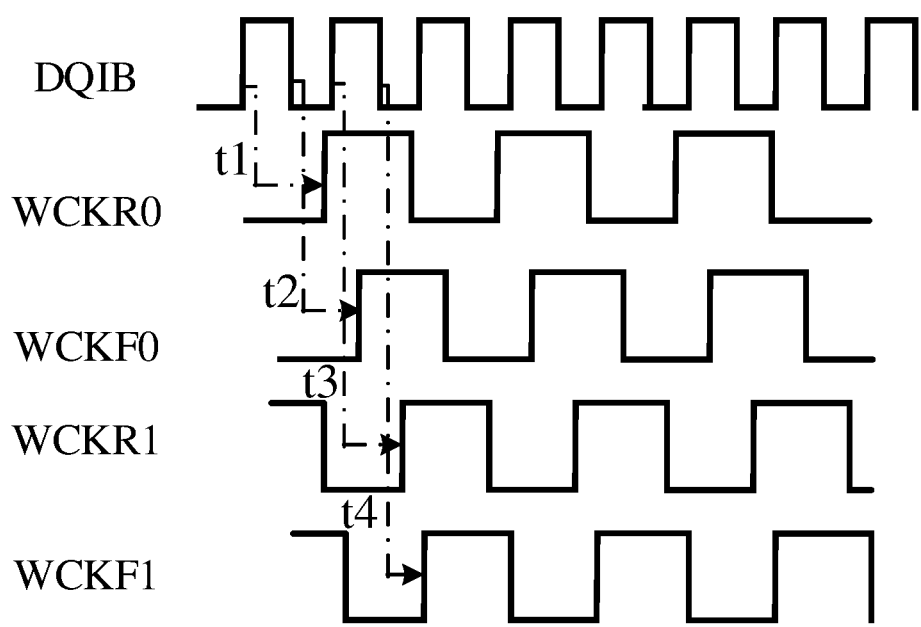
FIG. 3 schematically shows diagram of a simulation waveform of a DQ data signal and four clock sub-signals according to an exemplary embodiment of the present disclosure.

In an exemplary embodiment of the present disclosure, during the process for determining the setup time and the target sampling delay, it may be necessary to perform simulation on the DQ sample (DQ Sample). Referring to FIG. 3, the simulation on the DQ sample may refer to detecting when the correct DQR0 value can be output, in response to inputting different DQ data signal DQIB and clock sub-signal WCKR0. If the output DQR0 value is the correct value, the corresponding DQIB and WCKR0 input at this time can be used to determine the setup time tsetup. The setup time tsetup is a delay for the clock signal WCK to efficiently acquire data.

It should note that, during the simulation process of the DQ Sample, a default value of the delay parameter tWCK2DQI may be 0, and therefore, the actual delay parameter tWCK2DQI can be calculated from a simulation result of the DQ Sample.

In the present practical application, the DQIB and the WCKR0 are directly received for the DQ Sample, and the WCKR0 has no delay. Different clock sub-signals can obtain corresponding different setup times tsetup. Therefore, a plurality of setup times tsetup can be obtained from the simulation on the DQ Sample.

In practical applications, a test netlist may be generated according to a design database of the memory, and the test netlist may include test parameters, for example, the test parameters may be the setup time tsetup that is set initially, the delay time and data type of the DQ data signal DQIB, or the delay times of the plurality of clock sub-signals WCKR0, WCKF0, WCKR1 and WCKF1, etc. The simulation may be performed according to the test parameters, to determine a simulation waveform. Referring to FIG. 3, there is illustrated a simulation waveform including a DQ data signal DQIB and four clock sub-signals WCKR0, WCKF0, WCKR1 and WCKF1. In FIG. 3, it can be seen from the simulation waveform that there is a delay for each of the four clock sub-signals WCKR0, WCKF0, WCKR1, WCKF1 relative to the DQ data signal DQIB.

On the basis of the above simulation waveform, the delay parameter tWCK2DQI of the DQ data signal DQIB relative to the clock signal WCK can be determined according to an embodiment of the present disclosure.

In an exemplary embodiment of the present disclosure, the setup time tsetup may be determined based on the simulation results of the simulation on the DQ Sample under different PVTs (Pressure, Voltage, and Temperature). In general, during the simulation on the DQ Sample, there is no delay for the clock sub-signals, so the setup time tsetup may be equivalent to an initial value.

During the specific process of determining the setup time tsetup, the plurality of setup times tsetup may be obtained from the simulation on the DQ Sample, generally, the obtained plurality of setup times tsetup may be different in size. In order to improve the speed of data sampling and reserve sufficient time for subsequent sampling, a minimum value from the plurality of setup times tsetup may be selected as the setup time tsetup. The setup time tsetup under different PVTs may also be different, and therefore, the corresponding setup time tsetup can be set according to the actual situation, for example, the operating environment of the DRAM.

Correspondingly, the plurality of clock sub-signals may be simulated according to the actual circuit; and after determining an analog circuit, the corresponding sub-sampling delays may be obtained according to the analog circuit. For example, by inputting the clock signal and running the analog circuit in the simulation environment, the delayed clock sub-signal can be obtained. By setting the parameters in the analog circuit, the corresponding delay parameters can be finally obtained by simulation. It should be noted that the accuracy of the delay parameter may depend on the simulation degree of the analog circuit. Generally, the more parameters in the analog circuit, the more accurate it is; and the higher the simulation degree, the more accurate the delay parameters are.

Assuming that the simulation waveform as illustrated in FIG. 3 is acquired after the simulation of the analog circuit, the target sampling delay tmain of the plurality of clock sub-signals relative to the DQ data signal may be determined. In an exemplary embodiment of the present disclosure, the target sampling delay tmain may be a minimum sampling delay tmin of the plurality of clock sub-signals relative to the DQ data signal DQIB.

Taking the four clock sub-signals WCKR0, WCKF0, WCKR1 and WCKF1 in FIG. 3 as an example, the target sampling delay tmain may be the minimum sampling delay tmin of the four clock sub-signals WCKR0, WCKF0, WCKR1, WCKF1 relative to the DQ data signal DQIB.

In an exemplary embodiment of the present disclosure, the process for determining the target sampling delay tmain of the plurality of clock sub-signals WCKR0, WCKF0, WCKR1, WCKF1 relative to the DQ data signal DQIB may include the following. A delay from a rising edge or a falling edge of the DQ data signal DQIB to a rising edge of each of the clock sub-signals WCKR0, WCKF0, WCKR1 or WCKF1 may be determined as sampling delays t1, t2, t3, t4 of the clock sub-signals, respectively. A minimum value tmin from the determined sampling delays t1, t2, t3, t4 of the plurality of clock sub-signals may be determined as the target sampling delay tmain. Here, t1 is the sampling delay corresponding to the clock sub-signal WCKR0, t2 is the sampling delay corresponding to the clock sub-signal WCKF0, t3 is the sampling delay corresponding to the clock sub-signal WCKR1, and t4 is the sampling delay corresponding to the clock sub-signal WCKF1.

Specifically, the process for determining the target sampling delay tmain may be determined according to the data type of the DQ data signal DQIB. For example, in response to the DQ data signal that is written being 1010 data and the clock sub-signals including four clock sub-signals WCKR0, WCKF0, WCKR1, and WCKF1, a delay from a first rising edge of the DQ data signal DQIB to a rising edge of a first clock sub-signal WCKR0 may be determined as a first sub-sampling delay t1 of the first clock sub-signal WCKR0. A delay from a first falling edge of the DQ data signal DQIB to a rising edge of a second clock sub-signal WCKF0 may be determined as a second sub-sampling delay t2 of the second clock sub-signal WCKF0. A delay from a second rising edge of the DQ data signal DQIB to a rising edge of a third clock sub-signal WCKR1 may be determined as a third sub-sampling delay t3 of the third clock sub-signal WCKR1. A delay from a second falling edge of the DQ data signal DQIB to a rising edge of a fourth clock sub-signal WCKF1 may be determined as a fourth sub-sampling delay t4 of the fourth clock sub-signal WCKF1.

It should be noted that the aforementioned DQIB being 1010 data is only an example. In practical applications, the data type of the DQIB may be set according to actual needs, for example, 0101, etc. According to different data types, the specific determination manner of the sub-sampling delay may be changed correspondingly, and the exemplary embodiments of the present disclosure are not listed one by one.

Figure 4:
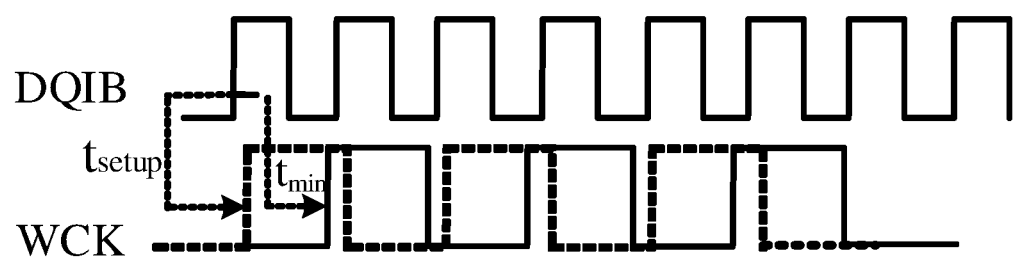
FIG. 4 schematically shows diagram of a waveform of a DQ data signal and a clock signal according to an exemplary embodiment of the present disclosure.

In an exemplary embodiment of the present disclosure, as illustrated in FIG. 4, after determining the target sampling delay tmain and the setup time tsetup, the delay parameter tWCK2DQI of the DQ data signal DQIB relative to the clock signal WCK may be determined according to the target sampling delay tmain and the setup time tsetup. For example, a difference between the target sample delay tmain and the setup time tsetup may be determined as the delay parameter tWCK2DQI, i.e., tWCK2DQI=tmain−tsetup=tmin−tsetup.

It should be noted that the simulation waveform may be used in the process for determining the target sampling delay tmain. Therefore, the rising edge and the falling edges of the aforementioned DQ data signal DQIB and the rising edge of each of the clock sub-signals WCKR0, WCKF0, WCKR1, and WCKF1 may be determined according to the simulation waveform. The specific simulation process can refer to the existing simulation means, which is not described in detail in the embodiment of the present disclosure.

As described above, in the method for determining the delay parameter according to the exemplary embodiment of the present disclosure, the target sampling delay and the setup time and the like may be determined according to the rising edge and the falling edge of the DQ data signal and the rising edges of the plurality of clock sub-signals, on the basis of the obtained simulation waveform by means of simulation. And the delay parameter of the DQ data signal relative to the clock signal may be determined based on the target sampling delay and the setup time, thereby realizing an automatic manner for determining the delay parameter from the data simulation level.

It should be noted that although the operations of the method of the present invention are described in a particular sequence in the drawings, it is not required or implied that the operations must be performed in that particular sequence, or that all of the illustrated operations must be performed to achieve the desired results. Additionally or alternatively, certain steps may be omitted, multiple operations may be combined into one operation for execution, and/or one operation may be decomposed into multiple operations for execution, etc.

Figure 5:
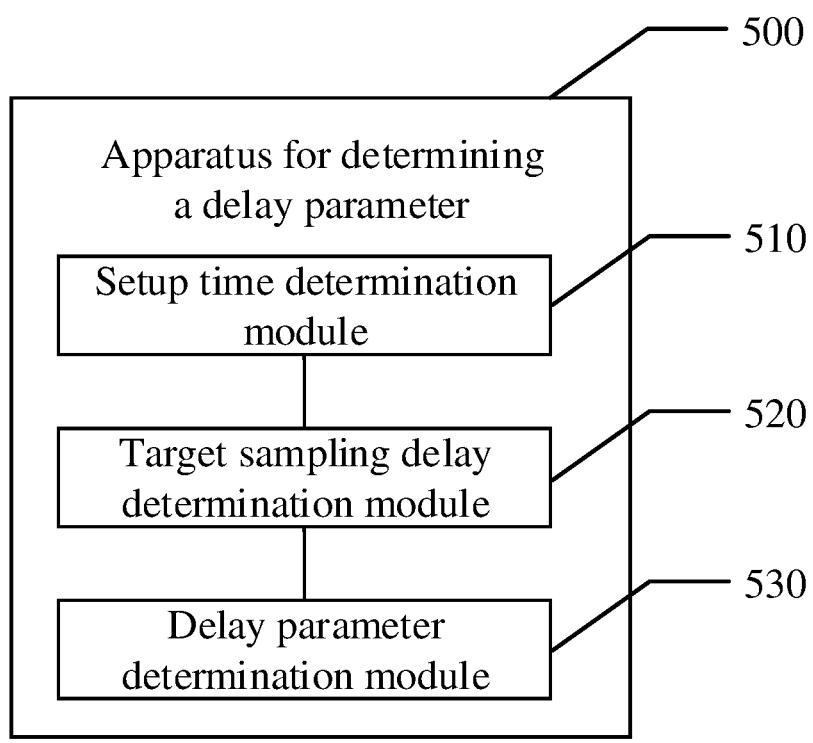
FIG. 5 schematically illustrates a first block diagram of an apparatus for determining a delay parameter according to an exemplary embodiment of the present disclosure.

Furthermore, an apparatus for determining a delay parameter is also provided in an exemplary embodiment of the present disclosure. Referring to FIG. 5, the apparatus 500 for determining the delay parameter includes a setup time determination module 510, a target sampling delay determination module 520, and a delay parameter determination module 530.

The setup time determination module 510 is configured to determine a setup time of a clock signal in a memory relative to a DQ data signal.

The target sampling delay determination module 520 is configured to divide the clock signal into a plurality of clock sub-signals, and determine a target sampling delay of the plurality of clock sub-signals relative to the DQ data signal.

The delay parameter determination module 530 is configured to determine, according to the target sampling delay and the setup time, a delay parameter of the DQ data signal relative to the clock signal.

In an exemplary embodiment of the present disclosure, the target sampling delay may be a minimum sampling delay of the plurality of the clock sub-signals relative to the DQ data signal.

In an exemplary embodiment of the present disclosure, the target sampling delay determination module 520 may be configured to determine a delay from a rising edge or a falling edge of the DQ data signal to a rising edge of each of the clock sub-signals, as a sampling delay of the clock sub-signal; and determine a minimum value from the determined sampling delays of the plurality of clock sub-signals as the target sampling delay.

In an exemplary embodiment of the present disclosure, the target sampling delay determination module 520 may be configured to, in response to the DQ data signal that is written being 1010 data and the clock sub-signals comprising four clock sub-signals, determine a delay from a first rising edge of the DQ data signal to a rising edge of a first clock sub-signal as a first sub-sampling delay of the first clock sub-signal; determine a delay from a first falling edge of the DQ data signal to a rising edge of a second clock sub-signal as a second sub-sampling delay of the second clock sub-signal; determine a delay from a second rising edge of the DQ data signal to a rising edge of a third clock sub-signal as a third sub-sampling delay of the third clock sub-signal; determine a delay from a second falling edge of the DQ data signal to a rising edge of a fourth clock sub-signal as a fourth sub-sampling delay of the fourth clock sub-signal; and determine a minimum sub-sampling delay from the first sub-sampling delay, the second sub-sampling delay, the third sub-sampling delay, and the fourth sub-sampling delay as the target sampling delay.

In an exemplary embodiment of the present disclosure, the delay parameter determination module 530 may be configured to determine a difference between the target sampling delay and the setup time as the delay parameter.

Figure 6:
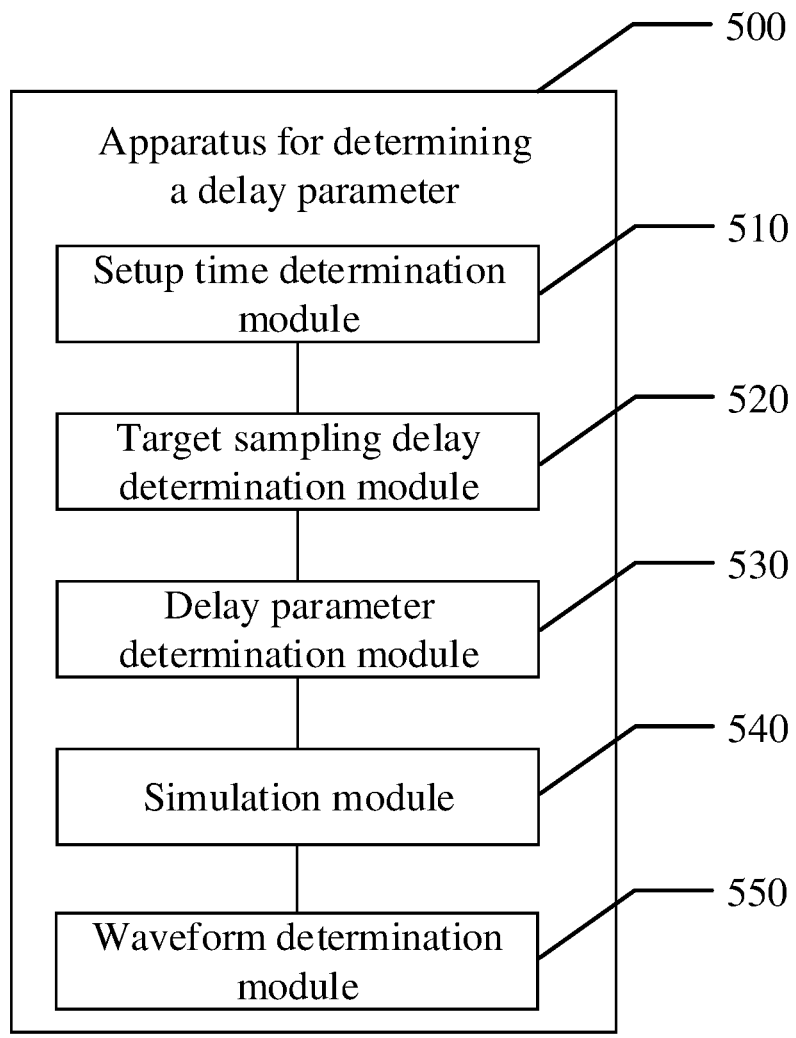
FIG. 6 schematically illustrates a second block diagram of an apparatus for determining a delay parameter according to an exemplary embodiment of the present disclosure.

In an exemplary embodiment of the present disclosure, referring to FIG. 6, the apparatus 500 for determining the delay parameter may further include a simulation module 540 and a waveform determination module 550.

The simulation module 540 may be configured to generate a test netlist according to a design database of the memory, the test netlist comprising test parameters, and perform simulation according to the test parameters, and determine a simulation waveform.

A waveform determination module 550 may be configured to determine, according to the simulation waveform, a rising edge and a falling edge of the DQ data signal and a rising edge of each of the clock sub-signals.

In an exemplary embodiment of the present disclosure, the setup time determination module 510 may be configured to determine the setup time according to a simulation result for a DQ sample.

The specific details of each of the virtual modules in the apparatus for determining the delay parameter described above have been described in detail in the corresponding method for determining the delay parameter, and therefore, details are not described herein again.

It should be noted that although several modules or units of the apparatus for determining the delay parameter are mentioned in the above detailed description, such division is not mandatory. Indeed, according to embodiments of the present disclosure, the features and functions of two or more modules or units described above may be embodied in one module or unit. Conversely, the features and functions of one module or unit described above may be further divided into a plurality of modules or units.

In an exemplary embodiment of the present disclosure, there is also provided an electronic device capable of implementing the aforementioned method.

Those skilled in the art will appreciate that various aspects of the present invention may be implemented as a system, a method, or a program product. Accordingly, various aspects of the present invention may be embodied in the following forms: a complete hardware implementation, a complete software implementation (including firmware, microcode, etc.), or a combination of the hardware implementation and the software implementation, which may be collectively referred to as "circuits", "modules" or "systems".

Figure 7:
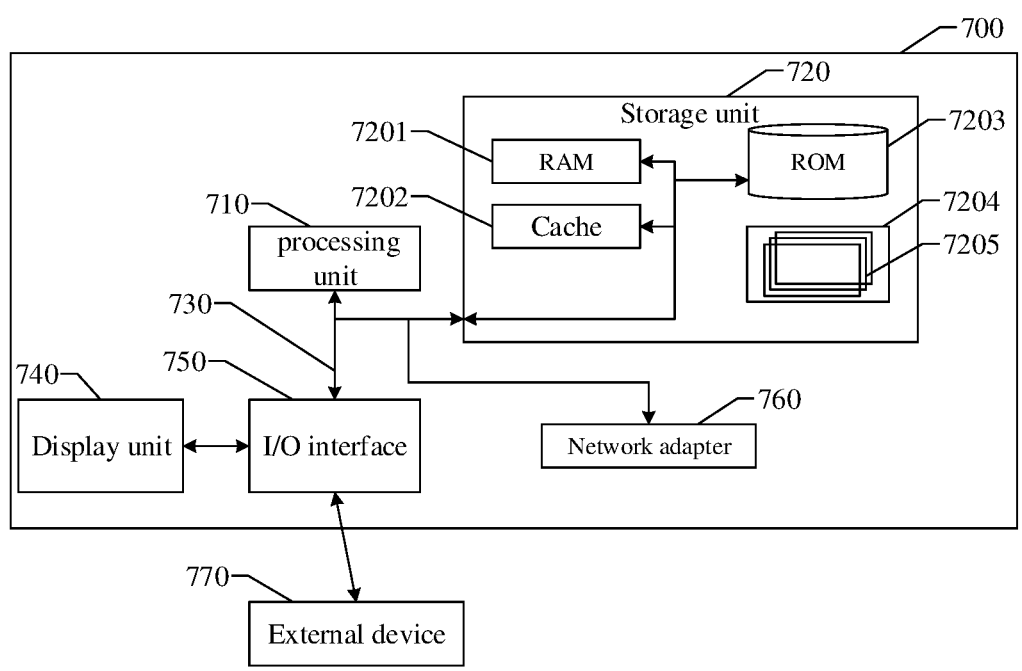
FIG. 7 schematically illustrates a module diagram of an electronic device according to an exemplary embodiment of the present disclosure.

Referring to FIG. 7, an electronic device 700 according to an embodiment of the present disclosure is provided. The electronic device 700 illustrated in FIG. 7 is merely an example and should not limit the functionality and scope of use of embodiments of the present disclosure.

As illustrated in FIG. 7, the electronic device 700 is illustrated in the form of a general-purpose computing device. The components of the electronic device 700 may include, but are not limited to, at least one processing unit 710, at least one storage unit 720, a bus 730 for connecting different system components (including the storage unit 720 and the processing unit 710), and a display unit 740.

The storage unit 720 stores program codes that are executed by the processing unit 710 to cause the processing unit 710 to perform the steps according to the various exemplary embodiments of the present disclosure described in the "exemplary method" embodiments described above. For example, the processing unit 710 may perform the following operations in FIG. 2: the operation S210 to determine a setup time of a clock signal in a memory relative to a DQ data signal; the operation S220 to divide the clock signal into a plurality of clock sub-signals, and determine a target sampling delay of the plurality of clock sub-signals relative to the DQ data signal; and the operation S230 to determine, according to the target sampling delay and the setup time, a delay parameter of the DQ data signal relative to the clock signal.

The storage unit 720 may include a readable medium in the form of a volatile storage unit, such as a random access storage unit (RAM) 7201 and/or a cache storage unit 7202, and may further include a read-only storage unit (ROM) 7203.

The storage unit 720 may also include a program/utility 7204 having a set (at least one) of a program module 7205. Such program module 7205 may include, but not limited to, an operating system, one or more application programs, other program modules, and program data, each or some combination of which may include an implementation of a network environment.

The bus 730 may represent one or more of the following several types of bus structures: a storage unit bus or a storage unit controller, a peripheral bus, a graphics acceleration port, a processing unit, or a local bus using any of a variety of bus structures.

The electronic device 700 may communicate with one or more external devices 770 (e.g., a keyboard, a pointing device, a Bluetooth device, etc.), may also communicate with one or more devices that enables a user to interact with the electronic device 700, and/or any device (e.g., router, modem, etc.) that enables the electronic device 700 to communicate with one or more other computing devices. Such communication may occur through an input/output (I/O) interface 750. Also, the electronic device 700 may also communicate with one or more networks (e.g., a Local Area Networks (LAN), a Wide Area Networks (WAN), and/or a public network, e.g., the Internet) through a network adapter 760. As illustrated, the network adapter 760 may communicate with other modules of the electronic device 700 via the bus 730. It should be appreciated that although not illustrated, other hardware and/or software modules may be used in conjunction with the electronic device 700, including, but not limited to, a microcode, a device driver, a redundant processing unit, an external disk drive array, a RAID system, a tape drive, and a data backup storage system, etc.

According to the description of the above embodiments, those skilled in the art will easily understand that the exemplary embodiments described herein may be implemented by software or by a combination of software and necessary hardware. Accordingly, the technical solutions according to the embodiments of the present disclosure may be embodied in the form of a software product, which may be stored in a non-volatile storage medium (which may be a CD-ROM, a U disk, a removable hard disk, etc.) or on a network. The software product includes several instructions to cause a computing device (which may be a personal computer, a server, a terminal device, or a network device, etc.) to perform the method according to the embodiments of the present disclosure.

In an exemplary embodiment of the present disclosure, there is also provided a computer-readable storage medium having stored thereon a program product capable of implementing the method of the present disclosure described above. In some possible implementations, various aspects of the present invention may also be implemented in the form of a program product including a program code. When the program product is run on a terminal device, the program code is used to cause the terminal device to perform the steps according to various exemplary embodiments of the present invention described in the "exemplary method" mentioned above.

According to an embodiment of the present disclosure, a program product for implementing the above method may employ a portable Compact Disc Read Only Memory (CD-ROM) and include a program code, and may be run on a terminal device, such as a personal computer. However, the program product of the present invention is not limited thereto, and in this document, a readable storage medium may be any tangible medium containing or storing a program that may be used by or in conjunction with an instruction execution system, an apparatus, or a device.

The program product may employ any combination of one or more readable media. The readable medium may be a readable signal medium or a readable storage medium. The readable storage medium may be, for example, but not limited to, an electrical, magnetic, optical, electromagnetic, infrared, or semiconductor system, apparatus, or device, or any combination thereof. More specific examples (a non-exhaustive list) of the readable storage medium may include an electrical connector with one or more wires, a portable disk, a hard disk, a RAM, a ROM, an Erasable Programmable Read-Only memory (EPROM or a flash memory), an optical fiber, a CD-ROM, an optical storage device, a magnetic storage device, or any suitable combination thereof.

The computer-readable signal medium may include a data signal propagated in a baseband or as part of a carrier, in which a readable program code is carried. A plurality of forms may be adopted for the propagated data signal, including, but not limited to, an electromagnetic signal, an optical signals, or any suitable combination thereof. The readable signal medium may also be any readable medium except the readable storage medium, and the readable medium may send, propagate, or transmit a program configured to be used by or in combination with an instruction execution system, apparatus, or device.

The program code in the readable medium may be transmitted with any suitable medium, including, but not limited to, a wireless medium, a wired medium, a fiber optic cable, a Radio Frequency (RF), etc., or any suitable combination thereof.

The program code for executing the operations of the present disclosure may be written in any combination of one or more programming languages, including object-oriented programming languages, such as Java, C++, etc., as well as conventional programming languages, such as "C" language or similar programming languages. The program code may be executed entirely on a user computing device, partly on the user device, as a separate software package, partly on the user computing device, partly on a remote computing device, or entirely on the remote computing device or a server. In the case of the remote computing device, the remote computing device may be connected to the user computing device through any kind of network, including a LAN or a WAN, or may be connected to an external computing device (e.g., through the Internet using an Internet service provider).

In addition, the above drawings are merely schematic illustrations of the processes included in the method according to the exemplary embodiments of the present disclosure, and are not intended to be limiting. It is easy to understand that the processes illustrated in the above drawings do not indicate or limit the temporal order of these processes. Moreover, it is also easy to understand that, for example, these processes may be performed synchronously or asynchronously in a plurality of modules.

Other embodiments of the present disclosure will readily be contemplated by those skilled in the art after considering the description and practicing the invention disclosed herein. The present disclosure is intended to cover any transformations, uses or adaptive variations of the disclosure, which follow the general principles of the present disclosure and include well-known common knowledge or conventional technical means in the art that are not disclosed in the present disclosure. The description and embodiments are only considered exemplary, and the practical scope and spirit of the present disclosure is indicated by the claims.

It should be understood that the present disclosure is not limited to the precise structure already described above and illustrated in the drawings, and that various modifications and changes may be made without departing from its scope. The scope of the present disclosure is limited only by the appended claims.

The invention claimed is:

1. A method for determining a delay parameter, comprising:
    determining a setup time of a clock signal in a memory relative to a DQ data signal;
    dividing the clock signal into a plurality of clock sub-signals, and determining a target sampling delay of the plurality of clock sub-signals relative to the DQ data signal; and
    determining, according to the target sampling delay and the setup time, a delay parameter of the DQ data signal relative to the clock signal.

2. The method of claim 1, wherein the target sampling delay is a minimum sampling delay of the plurality of the clock sub-signals relative to the DQ data signal.

3. The method of claim 2, wherein the determining the target sampling delay of the plurality of clock sub-signals relative to the DQ data signal comprises:
   determining a delay from a rising edge or a falling edge of the DQ data signal to a rising edge of each of the plurality of clock sub-signals, as a sampling delay of the clock sub-signal; and
   determining a minimum value from the determined sampling delays of the plurality of clock sub-signals as the target sampling delay.

4. The method of claim 3, wherein determining the target sampling delay comprises:
   in response to the DQ data signal that is written being 1010 data and the plurality of clock sub-signals comprising four clock sub-signals:
   determining a delay from a first rising edge of the DQ data signal to a rising edge of a first clock sub-signal as a first sub-sampling delay of the first clock sub-signal,
   determining a delay from a first falling edge of the DQ data signal to a rising edge of a second clock sub-signal as a second sub-sampling delay of the second clock sub-signal,
   determining a delay from a second rising edge of the DQ data signal to a rising edge of a third clock sub-signal as a third sub-sampling delay of the third clock sub-signal,
   determining a delay from a second falling edge of the DQ data signal to a rising edge of a fourth clock sub-signal as a fourth sub-sampling delay of the fourth clock sub-signal, and
   determining a minimum sub-sampling delay from the first sub-sampling delay, the second sub-sampling delay, the third sub-sampling delay, and the fourth sub-sampling delay as the target sampling delay.

5. The method of claim 1, wherein the determining, according to the target sampling delay and the setup time, the delay parameter of the DQ data signal relative to the clock signal comprises:
   determining a difference between the target sampling delay and the setup time as the delay parameter.

6. The method of claim 1, further comprising:
   generating a test netlist according to a design database of the memory, the test netlist comprising test parameters;
   performing simulation according to the test parameters, and determining a simulation waveform; and
   determining, according to the simulation waveform, a rising edge and a falling edge of the DQ data signal and a rising edge of each of the plurality of clock sub-signals.

7. The method of claim 1, wherein the setup time is determined according to a simulation result for a DQ sample.

8. An apparatus for determining a delay parameter, comprising:
   a processor; and
   a memory for storing executable instructions executed by the processor;
   wherein the processor is configured to:
   determine a setup time of a clock signal in a memory relative to a DQ data signal;
   divide the clock signal into a plurality of clock sub-signals, and determine a target sampling delay of the plurality of clock sub-signals relative to the DQ data signal; and
   determine, according to the target sampling delay and the setup time, a delay parameter of the DQ data signal relative to the clock signal.

9. The apparatus of claim 8, wherein the target sampling delay is a minimum sampling delay of the plurality of the clock sub-signals relative to the DQ data signal.

10. The apparatus of claim 9, wherein the processor is further configured to:
    determine a delay from a rising edge or a falling edge of the DQ data signal to a rising edge of each of the plurality of clock sub-signals, as a sampling delay of the clock sub-signal, and
    determine a minimum value from the determined sampling delays of the plurality of clock sub-signals as the target sampling delay.

11. The apparatus according to claim 10, wherein the processor is further configured to:
    in response to the DQ data signal that is written being 1010 data and the plurality of clock sub-signals comprising four clock sub-signals:
    determine a delay from a first rising edge of the DQ data signal to a rising edge of a first clock sub-signal as a first sub-sampling delay of the first clock sub-signal,
    determine a delay from a first falling edge of the DQ data signal to a rising edge of a second clock sub-signal as a second sub-sampling delay of the second clock sub-signal,
    determine a delay from a second rising edge of the DQ data signal to a rising edge of a third clock sub-signal as a third sub-sampling delay of the third clock sub-signal,
    determine a delay from a second falling edge of the DQ data signal to a rising edge of a fourth clock sub-signal as a fourth sub-sampling delay of the fourth clock sub-signal, and
    determine a minimum sub-sampling delay from the first sub-sampling delay, the second sub-sampling delay, the third sub-sampling delay, and the fourth sub-sampling delay as the target sampling delay.

12. The apparatus of claim 8, wherein the processor is further configured to determine a difference between the target sampling delay and the setup time as the delay parameter.

13. The apparatus of claim 8, wherein the processor is further configured to:
    generate a test netlist according to a design database of the memory, the test netlist comprising test parameters, perform simulation according to the test parameters, and determine a simulation waveform; and
    determine, according to the simulation waveform, a rising edge and a falling edge of the DQ data signal and a rising edge of each of the plurality of clock sub-signals.

14. The apparatus of claim 8, wherein the processor is further configured to determine the setup time according to a simulation result for a DQ sample.

15. A non-transitory computer-readable storage medium having stored thereon a computer program which, when executed by a processor, implements a method for determining a delay parameter, wherein the method comprises:
    determining a setup time of a clock signal in a memory relative to a DQ data signal;
    dividing the clock signal into a plurality of clock sub-signals, and determining a target sampling delay of the plurality of clock sub-signals relative to the DQ data signal; and
    determining, according to the target sampling delay and the setup time, a delay parameter of the DQ data signal relative to the clock signal.

16. The non-transitory computer-readable storage medium of claim 15, wherein the target sampling delay is a minimum sampling delay of the plurality of the clock sub-signals relative to the DQ data signal.

17. The non-transitory computer-readable storage medium of claim 16, wherein the determining the target sampling delay of the plurality of clock sub-signals relative to the DQ data signal comprises:

determining a delay from a rising edge or a falling edge of the DQ data signal to a rising edge of each of the plurality of clock sub-signals, as a sampling delay of the clock sub-signal; and determining a minimum value from the determined sampling delays of the plurality of clock sub-signals as the target sampling delay.

18. The non-transitory computer-readable storage medium of claim 17, wherein determining the target sampling delay comprises:

in response to the DQ data signal that is written being 1010 data and the plurality of clock sub-signals comprising four clock sub-signals:

determining a delay from a first rising edge of the DQ data signal to a rising edge of a first clock sub-signal as a first sub-sampling delay of the first clock sub-signal, determining a delay from a first falling edge of the DQ data signal to a rising edge of a second clock sub-signal as a second sub-sampling delay of the second clock sub-signal, determining a delay from a second rising edge of the DQ data signal to a rising edge of a third clock sub-signal as a third sub-sampling delay of the third clock sub-signal, determining a delay from a second falling edge of the DQ data signal to a rising edge of a fourth clock sub-signal as a fourth sub-sampling delay of the fourth clock sub-signal, and determining a minimum sub-sampling delay from the first sub-sampling delay, the second sub-sampling delay, the third sub-sampling delay, and the fourth sub-sampling delay as the target sampling delay.

19. The non-transitory computer-readable storage medium of claim 15, wherein the determining, according to the target sampling delay and the setup time, the delay parameter of the DQ data signal relative to the clock signal comprises:

determining a difference between the target sampling delay and the setup time as the delay parameter.

20. The non-transitory computer-readable storage medium of claim 15, wherein the method further comprises:

generating a test netlist according to a design database of the memory, the test netlist comprising test parameters;

performing simulation according to the test parameters, and determining a simulation waveform; and determining, according to the simulation waveform, a rising edge and a falling edge of the DQ data signal and a rising edge of each of the plurality of clock sub-signals.

\* \* \* \* \*